(12) United States Patent
Chiu et al.

(10) Patent No.: US 11,330,726 B2
(45) Date of Patent: May 10, 2022

(54) ELECTRONIC DEVICE

(71) Applicants: Yujun Chiu, Tainan (TW); Lavender Cheng, Tainan (TW)

(72) Inventors: Yujun Chiu, Tainan (TW); Lavender Cheng, Tainan (TW)

(73) Assignees: Yujun Chiu, Tainan (TW); Lavender Cheng, Tainan (TW)

( * ) Notice: Subject to any disclaimer, the term of this patent is extended or adjusted under 35 U.S.C. 154(b) by 51 days.

(21) Appl. No.: 16/935,461

(22) Filed: Jul. 22, 2020

(65) Prior Publication Data

US 2022/0030727 A1    Jan. 27, 2022

(51) Int. Cl.
| H05K 7/02 | (2006.01) |
| H05K 7/04 | (2006.01) |
| H05K 5/02 | (2006.01) |
| H05K 5/00 | (2006.01) |

(52) U.S. Cl.
CPC ......... H05K 5/0217 (2013.01); H05K 5/0017 (2013.01)

(58) Field of Classification Search
USPC ........................................ 361/807, 809, 810
See application file for complete search history.

(56) References Cited

U.S. PATENT DOCUMENTS

| 9,568,757 | B2 * | 2/2017 | Lee | ................... | G02F 1/133308 |
| 2005/0151895 | A1 | 7/2005 | Fukuyoshi et al. | | |
| 2007/0115207 | A1 | 5/2007 | Jang et al. | | |
| 2008/0137272 | A1 | 6/2008 | Cheng et al. | | |
| 2011/0286203 | A1 * | 11/2011 | Ogura | ............... | G02F 1/133608 362/97.1 |
| 2012/0327633 | A1 * | 12/2012 | Jang | ....................... | G02B 6/009 362/97.1 |
| 2014/0002768 | A1 * | 1/2014 | Kuo | .................. | G02F 1/133615 349/60 |
| 2016/0270244 | A1 * | 9/2016 | Ohtomo | ............ | G02F 1/133308 |

* cited by examiner

*Primary Examiner* — Hung S. Bui
(74) *Attorney, Agent, or Firm* — Patterson + Sheridan, LLP

(57) ABSTRACT

An electronic device is provided. The electronic device includes: a panel, a first cushioning component, and a second cushioning component. The panel includes a bottom surface, a first corner and a second corner, and the bottom surface connects between the first corner and the second corner. The first cushioning component supports the first corner of the panel. The second cushioning component supports the second corner of the panel. The Young's modulus of the first cushioning component and the Young's modulus of the second cushioning component are ranged from 500 MPa to 1500 MPa.

19 Claims, 9 Drawing Sheets

ELECTRONIC DEVICE

BACKGROUND

Field of the Disclosure

The present disclosure relates to an electronic device, and in particular to an electronic device having a plurality of cushioning components.

Description of the Related Art

Electronic devices are usually provided with a light-emitting element and a display panel to achieve the display function. Traditionally, the housing of the electronic device is made of a hard and inelastic plastic material, so it is necessary to arrange an additional spacer and leave a gap between the display panel and the housing. However, this makes it difficult to reduce the size of the frame of the electronic device and complicates the assembly process of the electronic device. Therefore, finding a way to solve the above problems has become an important issue.

BRIEF SUMMARY

Some embodiments of the disclosure provide an electronic device, including: a panel, a first cushioning component, and a second cushioning component. The panel includes a bottom surface, a first corner and a second corner, and the bottom surface connects between the first corner and the second corner. The first cushioning component supports the first corner of the panel. The second cushioning component supports the second corner of the panel. The Young's modulus of the first cushioning component and the Young's modulus of the second cushioning component are ranged from 500 MPa to 1500 MPa.

For making the above or other purposes, features and advantages of the present disclosure more clear, some embodiments are provided in the following paragraphs, and subsequent detailed description is provided as follows with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
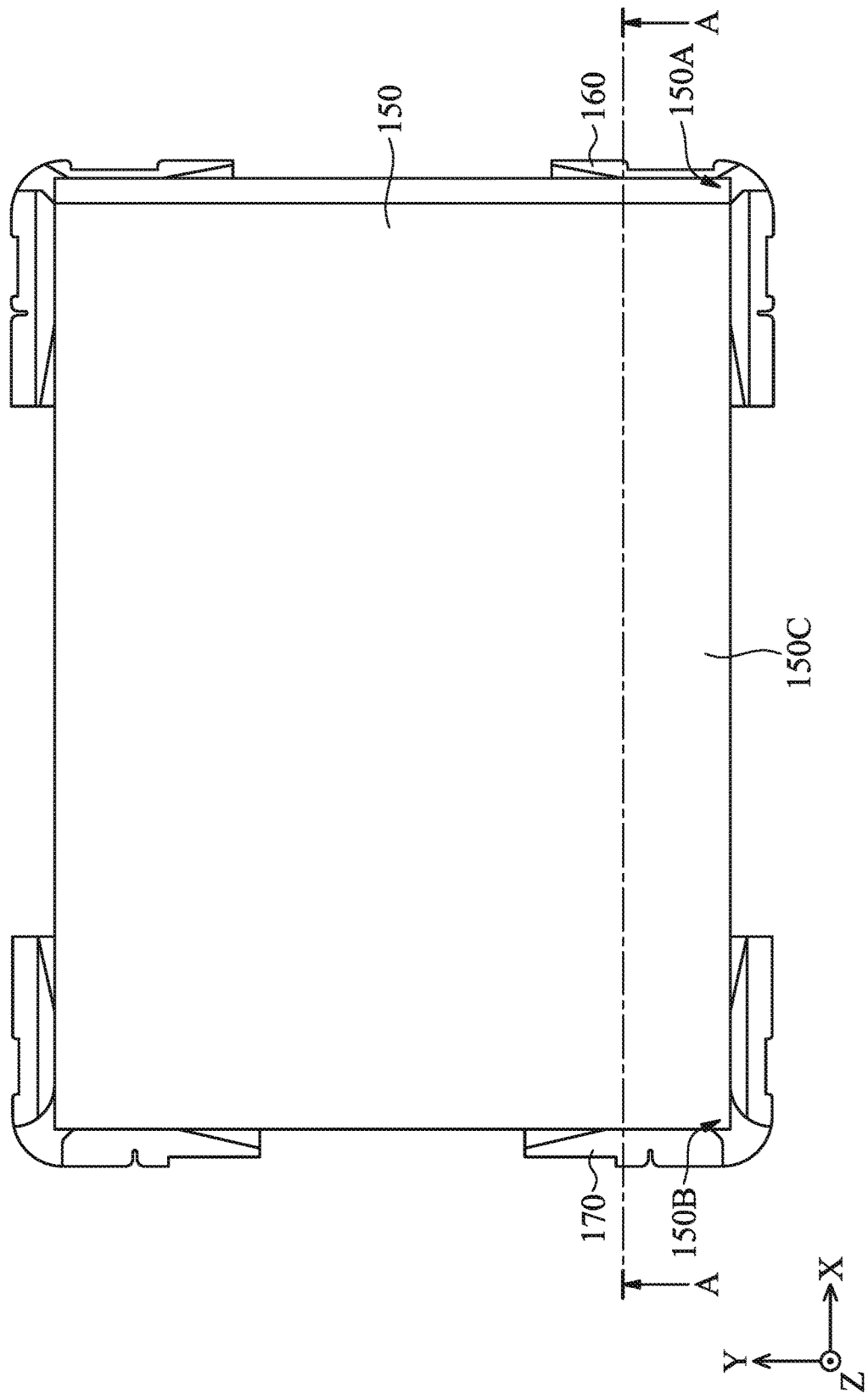
FIG. 1 is a top view illustrating an electronic device in accordance with some embodiments of the present disclosure.

The electronic devices of some embodiments of the present disclosure are described in the following description. The specific embodiments disclosed are provided merely to clearly describe the usage of the present disclosure by some specific methods without limiting the scope of the present disclosure.

The present disclosure can be understood by referring to the following detailed description and the accompanying drawings. It should be noted that, in order to make the reader easy to understand and the simplicity of the drawings, the multiple drawings in the present disclosure may merely illustrate a portion of the electronic device, and certain elements in the drawings are not drawn to actual scale. In addition, the number and size of each element in the figures are merely for illustration, and are not intended to limit the scope of the present disclosure.

Certain terms may be used throughout the present disclosure and the appended claims to refer to particular elements. Those skilled in the art would understand that electronic device manufacturers may refer to the same components under different names. The present specification is not intended to distinguish between components that have the same function but different names. In the following specification and claims, the words "including", "containing", "having" and the like are open words, so they should be interpreted as meaning "including but not limited to . . . " Therefore, when the terms "including", "containing" and/or "having" are used in the description of the present disclosure, they specify the existence of corresponding features, regions, steps, operations, and/or components, but do not exclude one or more existence of a corresponding feature, region, step, operation, and/or component.

In addition, in this specification, relative expressions may be used. For example, "lower", "bottom", "higher" or "top" are used to describe the position of one element relative to another. It should be noted that if a device is flipped upside down, an element that is "lower" will become an element that is "higher."

When a corresponding component (such as a film layer or region) is referred to as "on another component", it may be directly on another component, or there may be other components in between. On the other hand, when a component is called "directly on another component", there is no component between the former two. In addition, when a component is called "on another component", the two components have an up-down relationship in the top view, and this component can be above or under the other component, and this up-down relationship depends on the orientation of the device.

It should be understood that, although the terms "first", "second," etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the term "substrate" in the following paragraphs may include elements formed on the substrate or various layers covering the substrate, such as any active component (e.g. transistor) that is formed thereon as required. However, in order to simplify the figures herein, it is shown as a plane substrate.

FIG. 1 is a cross-sectional view illustrating an electronic device 100 in accordance with some embodiments of the present disclosure. It should be noted that the electronic device 100 may include a display device, a light-emitting device, a sensing device, a touch display, a curved display or a free shape display, but is not limited thereto. The electronic device may be a bendable or flexible electronic device. The electronic device may include, for example, a light-emitting diode, fluorescence, phosphor, other suitable display medium or a combination thereof, but is not limited thereto. The light-emitting diode may include, for example, an organic light-emitting diode (OLED), a mini LED, a micro LED or quantum dot (QD) light-emitting diode (which may be referred to as QLED, QDLED), other suitable materials, or an arbitrary combination thereof, but it is not limited thereto. The display device may include a tiled display device, but it is not limited thereto. It should be noted that the electronic device may be an arbitrary combination thereof, but it is not limited thereto. In addition, the appearance of the electronic device may be rectangle, polygon, a shape with curved edges or any other suitable shape. The electronic device may have peripheral systems, such as a driving system, a control system, a light source system, a shelf system, etc., to support the display device or the tiled device. It should be noted that the electronic device may be any combination thereof, but it is not limited thereto. The present disclosure is described in a manner that a display device serves as the electronic device as follows, but the present disclosure is not limited thereto.

As shown in FIG. 1, the display device 100 includes a panel 150. To clearly understand the relative positional relationship between the panel and the cushioning component, FIG. 1 merely shows the panel 150 and the cushioning component, and other elements are omitted. As shown in FIG. 1, the panel 150 is rectangular, but it is not limited thereto. In the present embodiment, the panel 150 has a first corner 150A, a second corner 150B, and a bottom surface 150C, wherein the bottom surface 150C connects the first corner 150A and the second corner 150B. The electronic device 100 further includes a first cushioning component 160 and a second cushioning component 170, each of which corresponds to the first corner 150A and the second corner 150B of the panel 150, respectively. In some embodiments, the electronic device 100 is in an upright configuration. When users look at the panel 150, the first corner 150A, the second corner 150B, and the bottom surface 150C are located below (i.e. the lower part). At this time, the first cushioning component 160 supports the first corner 150A of the panel 150, and the second cushioning component 170 supports the second corner 150B of the panel 150. In some embodiments, the electronic device 100 may be provided with at least two cushioning components, each corresponding to the corners of the panel 150, but is not limited thereto. The Young's modulus of the first cushioning component 160 and the Young's modulus of the second cushioning component 170 are in a range from 500 MPa to 1500 MPa (500 MPa≤Young's modulus≤1500 MPa), such as 600 MPa, 700 MPa, 800 MPa, 900 MPa, 1000 MPa, 1100 MPa, 1200 MPa, 1300 MPa, 1400 MPa, etc., but not limited to the values listed above. For example, the materials of the first cushion component 160 and the second cushion component 170 may include thermoplastic vulcanizate (TPV), thermoplastic elastomer (TPE), etc., but not limited thereto.

Figure 2:
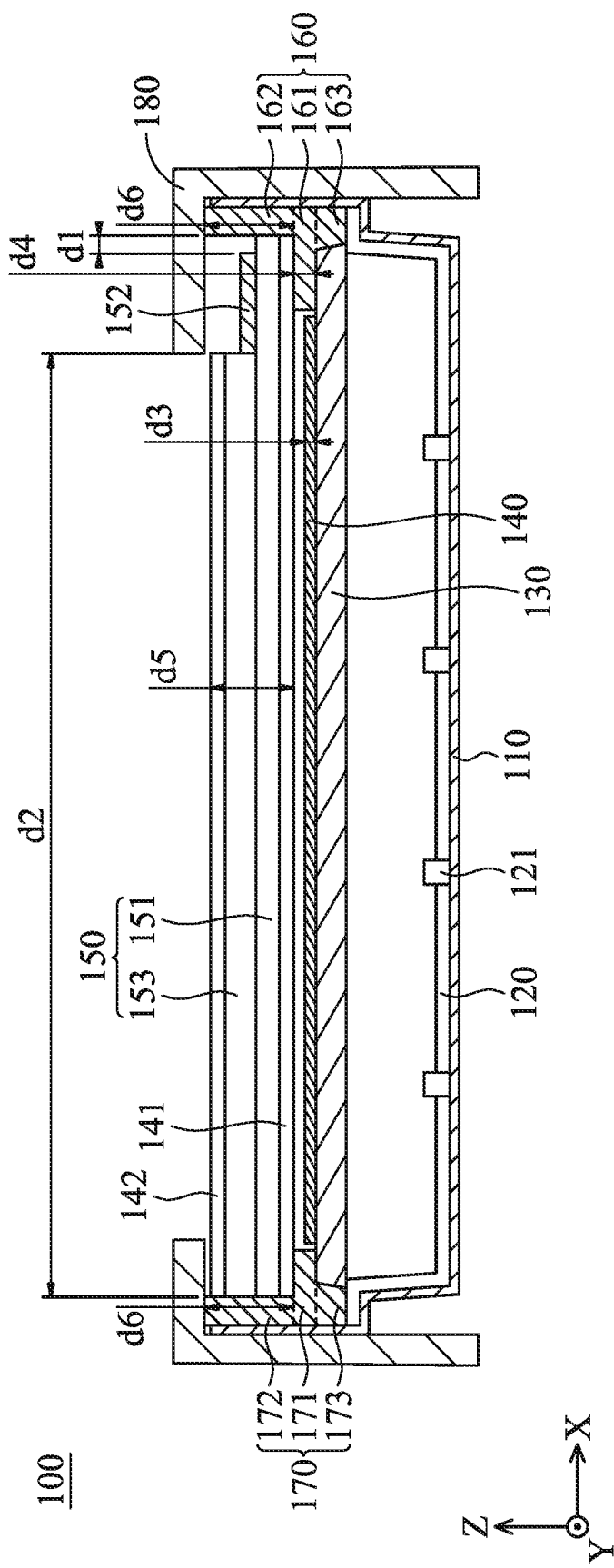
FIG. 2 is a cross-sectional view along line A-A shown in FIG. 1.

Please refer to FIG. 2, which illustrates a cross-sectional view along line A-A shown in FIG. 1. In the present embodiment, the electronic device 100 may optionally include a backlight module, but it is not limited thereto. In other embodiments, the backlight module may not be provided. As shown in FIG. 2, the electronic device 100 includes a back plate 110. In some embodiments, the back plate 110 may include metal, plastic, other suitable materials, or a combination thereof, but is not limited thereto. The back plate 110 may have a certain structural strength for supporting the electronic device 100. A reflective sheet 120 and a light-emitting element 121 are disposed on the back plate 110, wherein the light-emitting element 121 is disposed on the reflective sheet 120, so that the light emitted by the light-emitting element 121 may be reflected by the reflective sheet 120 to the panel 150 of the electronic device 100, achieving the effect of display.

In the present embodiment, the cushioning component 160 includes a main portion 161, a side portion 162, and a support portion 163, wherein the main portion 161 extends in a direction that is substantially parallel to the panel 150 (e.g. X-Y plane), the side portion 162 and the support portion 163 protrude from the main portion 161 substantially along the Y axis, and the side portion 162 and the support portion 163 are located on opposite sides of the main portion 161, respectively. Similarly, the second cushioning component 170 includes a main portion 171, a side portion 172, and a support portion 173, wherein the main portion 171 extends in a direction that is substantially parallel to the panel 150, the side portion 172 and the support portion 173 protrude substantially along the Y axis, and the side portion 172 and the support portion 173 are located on opposite sides of the main portion 171. In the present embodiment, the reflective sheet 120 extends under the first cushioning component 160 and the second cushioning component 170, and the support portion 163 and the support portion 173 contact the reflective sheet 120. In other words, a portion of the reflective sheet 120 contacts the support portion 163 and the support portion 173.

A diffusion plate 130 is disposed on the reflective sheet 120 and the light-emitting element 121 to diffuse the light source from the light-emitting element 121. In the present embodiment, the diffusion plate 130 is disposed between the support portion 163 and the support portion 173. In some embodiments, the diffusion plate 130 contacts the lower surfaces of the main portion 161 and the main portion 171 (i.e. the surfaces facing the light-emitting element 121). In other embodiments, the diffusion plate 130 may not contact the lower surfaces of the main portion 161 and the main portion 171, but it is not limited thereto. An optical film 140 is disposed on the diffusion plate 130 to perform appropriate optical treatment on the light passing through the diffusion plate 130. In the present embodiment, the optical film 140 is located between the main portion 161 and the main portion 171. The thickness d3 of the optical film 140 is less than the thickness of the main portion 161 or the main portion 171 (for example, the thickness d4 shown in FIG. 2), but it is not limited thereto. In some embodiments, the thickness d3 of the optical film 140 may be substantially equal to the thickness of the main portion 161 or the main portion 171 (for example, the thickness d4 shown in FIG. 2). In addition, the optical film 140 may be composed of multiple optical films, or one optical film having multiple layers. The above thicknesses of the optical film 140, the main portion 161, and the main portion 171 are measured in the Y direction. For example, the thickness of the main portion 161 and the main portion 171 may be in a range from about 1.2 mm to about 1.6 mm (1.2 mm≤thickness≤1.6 mm), such as 1.3 mm, 1.4 mm, 1.5 mm, etc., but not limited to the values listed above. In some embodiments, the thickness of the main portion (such as the main portion 161 and the main portion 171) may be the maximum thickness. In some embodiments, the size of the optical film 140 is substantially less than the size of the diffusion plate 130, wherein the aforementioned sizes of the optical film 140 and the diffusion plate 130 are measured along the X-Y plane, for example.

The panel 150 is disposed on the optical film 140. The panel 150 includes a substrate 151 and a counter substrate 153 that is disposed on the substrate 151. For example, the substrate 151 may be a thin film transistor (TFT) substrate, a color filter on array substrate or a color filter substrate. The counter substrate 153 may be a thin film transistor (TFT) substrate, color filter on array substrate, and color filter substrate, and may be adjusted appropriately as required. The circuit board 152 may include flexible printed circuit (FPC), chip on film (COF), and other structures, but is not limited thereto. In the present embodiment, the circuit board 152 is disposed on one side of the substrate 151 (for example, the right side in FIG. 2, but not limited thereto), wherein the circuit board 152 may be adjacent to the counter substrate 153. In one embodiment, the area of the counter substrate 153 is different from the area of the substrate 151. In some embodiments, the area of the substrate 151 may be substantially greater than or equal to the area of the counter substrate 153, at least a portion of the circuit board 152 is located between the substrate 151 and the counter substrate 153, and at least another portion of the circuit board 152 may be folded back to the back side of the panel 150 (the side close to the substrate 151). The aforementioned areas of the counter substrate 153 and the substrate 151 refer to the areas of the counter substrate 153 and the substrate 151 on the X-Y plane.

In some embodiments, the shortest distance d1 between the circuit board 152 and the side portion 162 of the first cushioning component 160 is less than the shortest distance d2 between the circuit board 152 and the side portion 172 of the second cushioning component 170. The circuit board 152 may be used to electrically connect the panel 150 to an external circuit (such as a control circuit). The external circuit may be a circuit design that is not located inside the substrate 151 and needs to be electrically connected via pads on the circuit board 152, so that the external circuit may control signals or transfer the signal to the substrate 151. In some embodiments, the circuit board 152 may be disposed on the bottom surface 150C of the panel 150 (as shown in FIG. 1).

In the present embodiment, the first cushioning component 160 may be disposed on one side that is close to the circuit board 152, and the second cushioning component 170 is disposed on another side that is away from the circuit board 152. In some embodiments, the panel 150 may be disposed on the main portion 161 of the first cushioning component 160 and the main portion 171 of the second cushioning component 170, and contact the side portion 162 of the first cushioning component 160 and the side portion 172 of the second cushioning component 170. If the Young's modulus of the first cushioning component 160 or the second cushioning component 170 is too large, there may be insufficient support for the panel 150. If the Young's modulus of the first cushioning component 160 or the second cushioning component 170 is too small, there is no enough elasticity for cushioning when the panel 150 is collided or pressed again. Therefore, the first cushioning component 160 or the second cushioning component 170 needs to have an appropriate range of Young's modulus to help for preventing the panel 150 from being damaged or providing cushion for the panel 150.

In addition, a lower polarizer sheet 141 may be disposed under the panel 150, and an upper polarizer sheet 142 may be disposed on the panel 150, but the present disclosure is not limited thereto. In the present embodiment, the lower polarizer sheet 141 and the upper polarizer sheet 142 are both located above the main portion 161 and the main portion 171. In some embodiments, those skilled in the art may adjust the configuration or number of the lower polarizer sheet 141 and the upper polarizer sheet 142 as required. In other words, the lower polarizer sheet 141 or the upper polarizer sheet 142 may be selectively disposed, or a plurality of lower polarizer sheets 141 or a plurality of upper polarizer sheets 142 may be disposed. In some embodiments, the thickness (for example, the thickness d6 shown in FIG. 2) of the side portion 162 (and the side portion 172) may be substantially equal to the total thickness of the panel 150, the lower polarizer sheet 141, and the upper polarizer sheet 142 (for example, the thickness d5 shown in FIG. 2). More specifically, the ratio of the thickness (for example, the thickness d6 shown in FIG. 2) of the side portion 162 (and side portion 172) to the total thickness of the panel 150, the lower polarizer sheet 141, and the upper polarizer sheet 142 (for example, the thickness d5 shown in FIG. 2) may be in a range from 90% to 110% (90%≤thickness ratio≤110%), such as 95%, 100% (that is, the former two are equal), 105%, etc., but it is not limited to the values listed above. The above configuration may reduce the probability of generating defects such as light leakage in the electronic device 100. In some embodiments, the thickness of the side portion (such as the side portion 162 and the side portion 172) may be the maximum thickness.

In addition, a housing 180 may be selectively disposed to protect components inside the electronic device 100. In the present embodiment, the housing 180 is disposed on the first cushioning component 160, the second cushioning component 170 and the back plate 110, and the housing 180 may extend to the outside of the back plate 110. In some embodiment, the back plate may dispose under the panel. For example, the material of the housing 180 may include metal, plastic, other suitable materials, or a combination thereof, but is not limited thereto.

Figure 3:
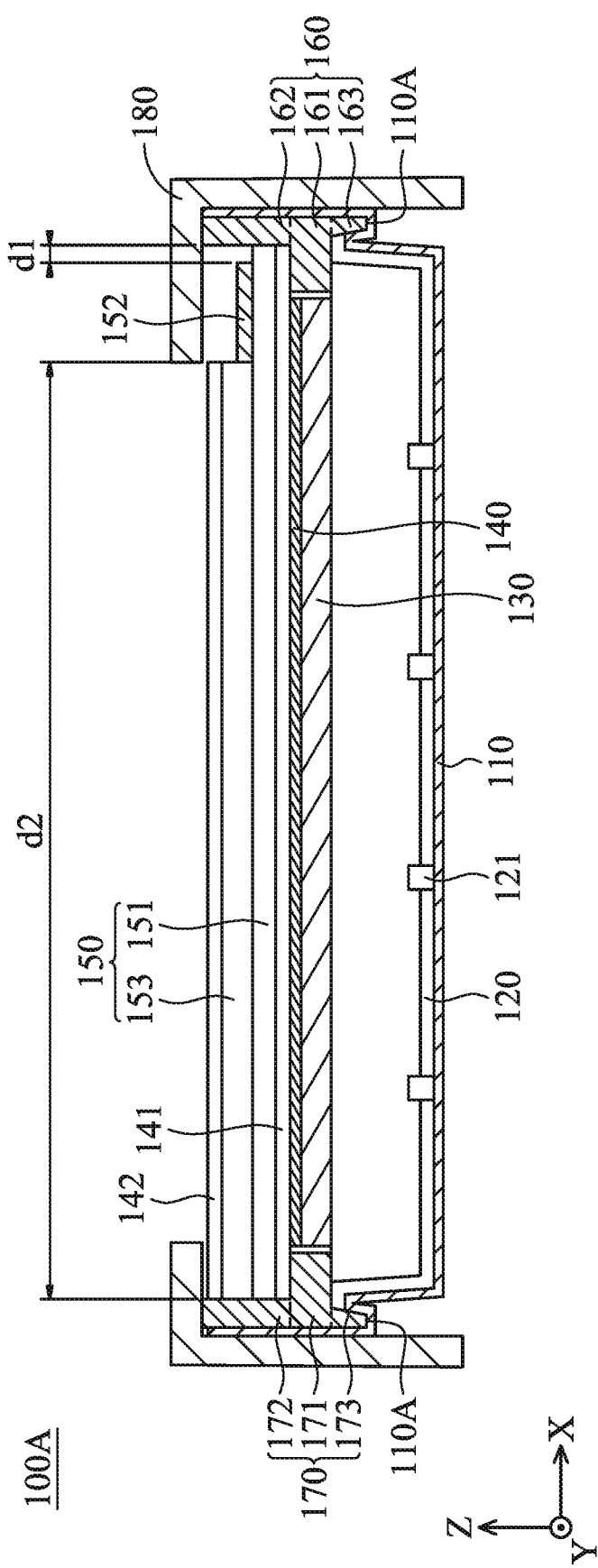
FIG. 3 is a cross-sectional view illustrating the electronic device in accordance with some embodiments of the present disclosure.

FIG. 3 is a cross-sectional view illustrating an electronic device 100A in accordance with some embodiments of the present disclosure. It should be understood that the electronic device 100A in the present embodiment may include the same or similar portions as that of the electronic device 100 shown in FIG. 2. For the sake of simplicity, these same or similar portions will be denoted by the same or similar numerals, and will not be described in detail. For example, the electronic device 100A includes a back plate 110, a reflective sheet 120, a light-emitting element 121, a diffusion plate 130, an optical film 140, a panel 150, a first cushioning component 160, a second cushioning component 170, and a housing 180.

The difference between the electronic device 100A in the present embodiment and the electronic device 100 shown in FIG. 2 is that the back plate 110 has a recess 110A for arranging the support portion 163 of the first cushioning component 160 and the support portion 173 of the second cushioning component 170. That is, the support portion 163 and the support portion 173 can be accommodated in the recess 110A. In the present embodiment, the recess 110A may extend in the Y direction, but is not limited thereto. In some embodiments, the recess 110A may have a shape corresponding to the support portion 163 and the support portion 173 (namely, a shape that is similar to the support portion 163 and the support portion 173). The arrangement of the recess 110A may help the assembly and positioning of the first cushioning component 160 and the second cushioning component 170, or may provide more stable support for the first cushioning component 160 and the second cushioning component 170. In some embodiments, the main portion 161 and/or the support portion 163 of the first cushioning component 160 may contact the reflective sheet 120. Similarly, in some embodiments, the main portion 171 and/or the support portion 173 of the second cushioning component 170 may contact the reflective sheet 120, but the present disclosure is not limited thereto.

In addition, in some embodiments, the size of the optical film 140 is substantially equal to the size of the diffusion plate 130, wherein the aforementioned sizes of the optical film 140 and the diffusion plate 130 are measured along the X-Y plane, for example. In some embodiments, the optical film 140 and the diffusion plate 130 are substantially overlapped. In addition, in some embodiments, the overall thickness of the optical film 140 and the diffusion plate 130 may be substantially equal to the thickness of the main portion 161 or the main portion 171. The aforementioned thicknesses of the optical film 140, the diffusion plate 130, the main portion 161, and the main portion 171 are measured in the Y direction, for example.

The detailed structure of the electronic device 100 (or the electronic device 100A) will be described more specifically below, but it is merely for illustration, and does not mean that it is actually necessary to follow the manner described in the embodiments of the present disclosure. The different structural features shown in the following embodiments may be adjusted independently. In other words, the electronic device 100 and the electronic device 100A described in the present disclosure may include all or part of the structural features shown in the following embodiments. It should be understood that although only partial structure of the electronic device 100 (or the electronic device 100A) is shown, the above structure may be suitably applied to the overall structure of the electronic device 100 (or the electronic device 100A), which will not be described in detail below.

Figure 4:
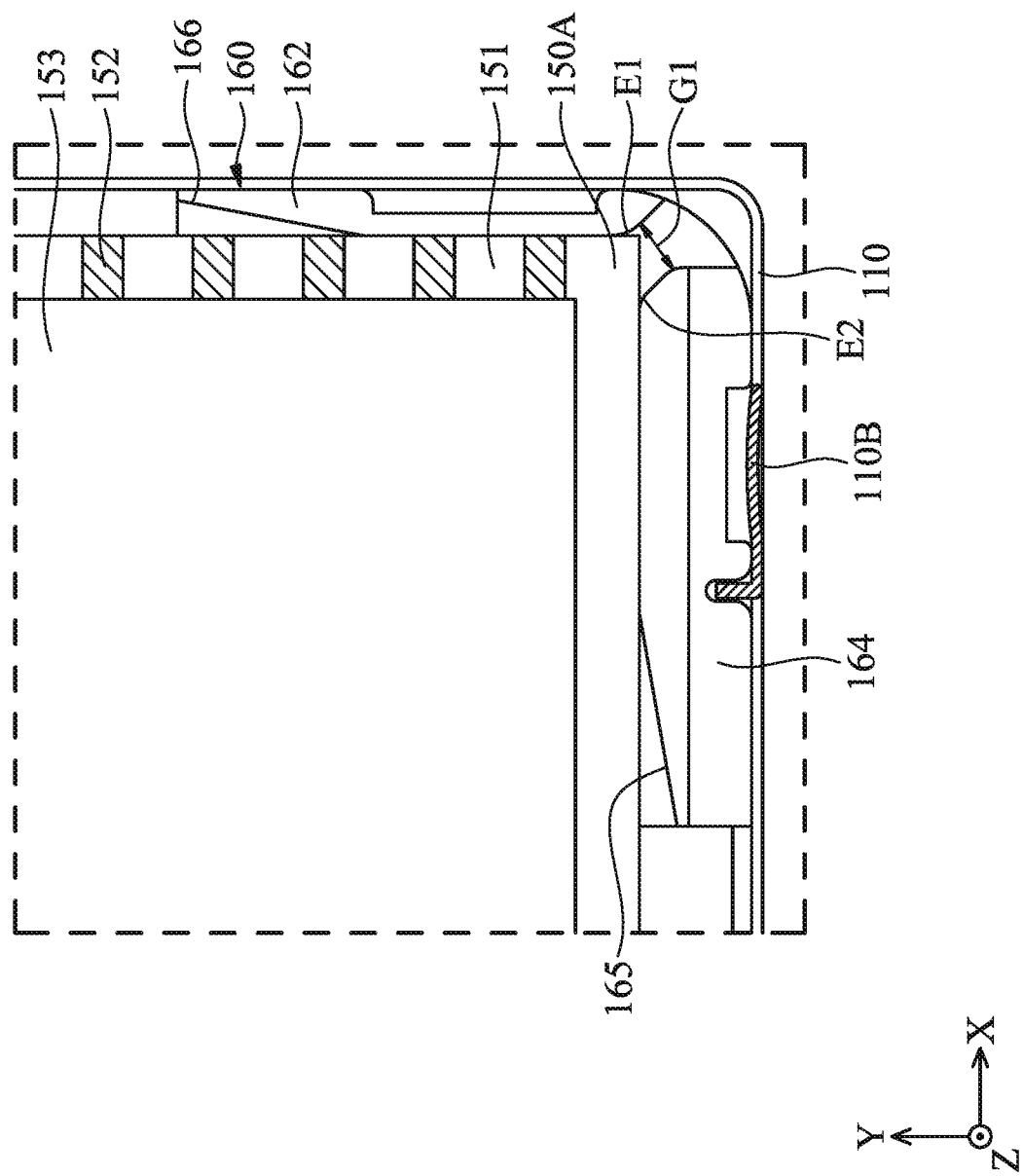
FIG. 4 is a partial enlarged view illustrating the electronic device in accordance with some embodiments of the present disclosure.

FIG. 4 is a partial enlarged view illustrating the electronic device 100 in accordance with some embodiments of the present disclosure. As shown in FIG. 4, the first cushioning component 160 further includes a side portion 164, which is disposed relative to the side portion 162. More specifically, a first gap G1 is formed between the side portion 162 and the side portion 164, and the first gap G1 corresponds to the first corner 150A of the panel 150. In some embodiments, the panel 150 may contact the side portion 164 and the side portion 162, and the first gap G1 may accommodate the first corner 150A of the panel 150. A rounded corner or a chamfer may be disposed at an end portion E1 of the side portion 162 and an end portion E2 of the side portion 164, the end portion E1 and the end portion E2 face the first gap G1, which may help to accommodate the first corner 150A of the panel 150. The arrangement of the first gap G1, the side portion 162 and the side portion 164 may be provided for a cushion space when deformed due to thermal expansion, contraction or pressing, without affecting the overall structure of the electronic device 100. In addition, in some embodiments, the end portion (such as the end portion E1 or the end portion E2) may be located at a place where is a quarter of the overall length of the side portion (such as the side portion 162 and the side portion 164) and close to the corner. For example, the end portion E1 may be located at a place where is a quarter of the overall length of the side portion 162 and close to the first corner 150A.

The side portion 164 further includes a beveled edge 165 extending away from the panel 150. In other words, the beveled edge 165 may be separated from the panel 150, thereby guiding the arrangement of the panel 150 during the assembly of the panel 150, or reducing the difficulty of arranging the panel 150. Similarly, the side portion 162 also includes a beveled edge 166 that extends away from the panel 150. In some embodiments, the edge of the side 164 facing the panel 150 may be curved. Due to the above design, the width of the side portion 164 of the first cushioning component 160 in the Z direction is not completely uniform. In the present embodiment, where the maximum width (for example, the fifth width W5) of the side portion 164 is provided is closer to the first corner 150A than where the minimum width (for example, the sixth width W6) of the side portion 164 is provided (that is, where the beveled edge 165 is disposed), providing better protection for the panel 150. To be more specific, the place where the maximum width of the side portion 164 is would be closer to the end portion E2 of the side portion 164 than the place (i.e. where the beveled edge 165 is disposed) where the minimum width (such as the sixth width W6) of the side portion 164 is. The end portion E2 may be located at a place where is a quarter of the overall length of the side portion 164 and close to the first corner 150A. Another end portion (not labeled) of the side portion 164 may be located at a place where is a quarter of the overall length of the side portion 164 and away from the first corner 150A. In addition, the first cushioning component 160 is also provided with a groove-shaped structure, which may be assembled with a convex structure (such as the convex structure 110B) around the back plate 110.

Figure 5:
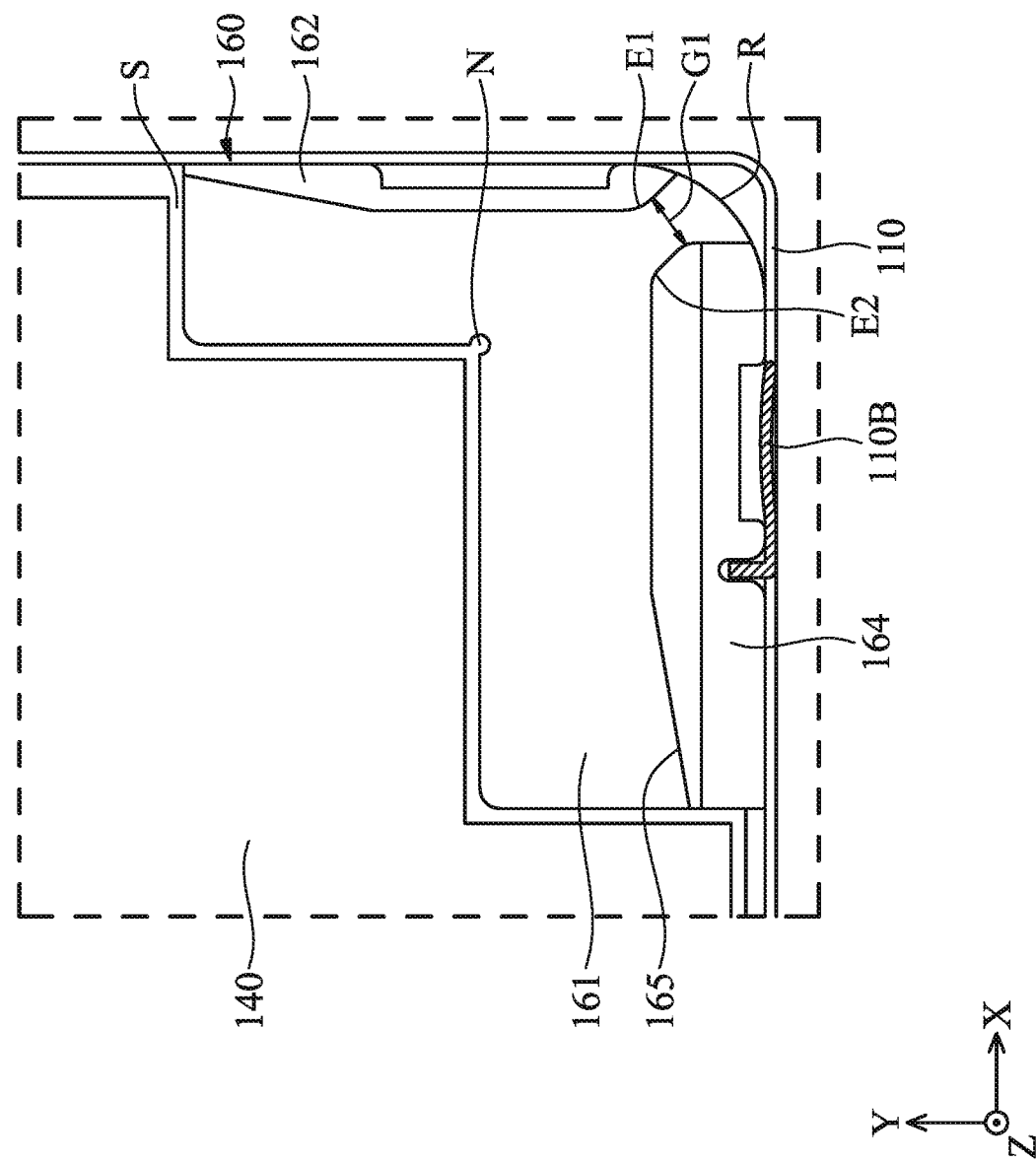
FIG. 5 is a partial enlarged view illustrating the electronic device in accordance with some embodiments of the present disclosure.

FIG. 5 is a partial enlarged view illustrating the electronic device 100 in accordance with some embodiments of the present disclosure. It should be noted that in order to clearly show the internal structure of the electronic device 100, the panel 150 is not shown in FIG. 5. Those skilled in the art should understand that the panel 150 or any other suitable panel may be disposed in the electronic device 100 shown in the present embodiment. As shown in FIG. 5, a spacing S is formed between the first cushioning component 160 and the optical film 140 to increase the probability of matching the first cushioning component 160 with the optical film 140, but it is not limited thereto. More specifically, in a top view, the contour of the first cushioning component 160 facing the panel corresponds to the contour of the optical film 140, making the assembly of the optical film 140 more easier. In some embodiments, the first cushioning component 160 may directly contact the optical film 140. In the present embodiment, the main portion 161 has a notch N, which is disposed to face the optical film 140. The arrangement of the notch N may reduce the probability that the optical film 140 is damaged due to the collision with the main portion 161 or the probability that the optical film 140 is warped due to the contact with the main portion 161. In addition, the main portion 161 has a rounded corner R at the corner facing the back plate 110, thereby providing a cushioning space between the main portion 161 and the back plate 110. During assembly, the corner of the panel (for example, the first corner 150A) is disposed corresponding to the rounded corner R of the main portion 161, which reduces the possibility that assemblers scratched by the corners of the panel during assembly.

Figure 6:
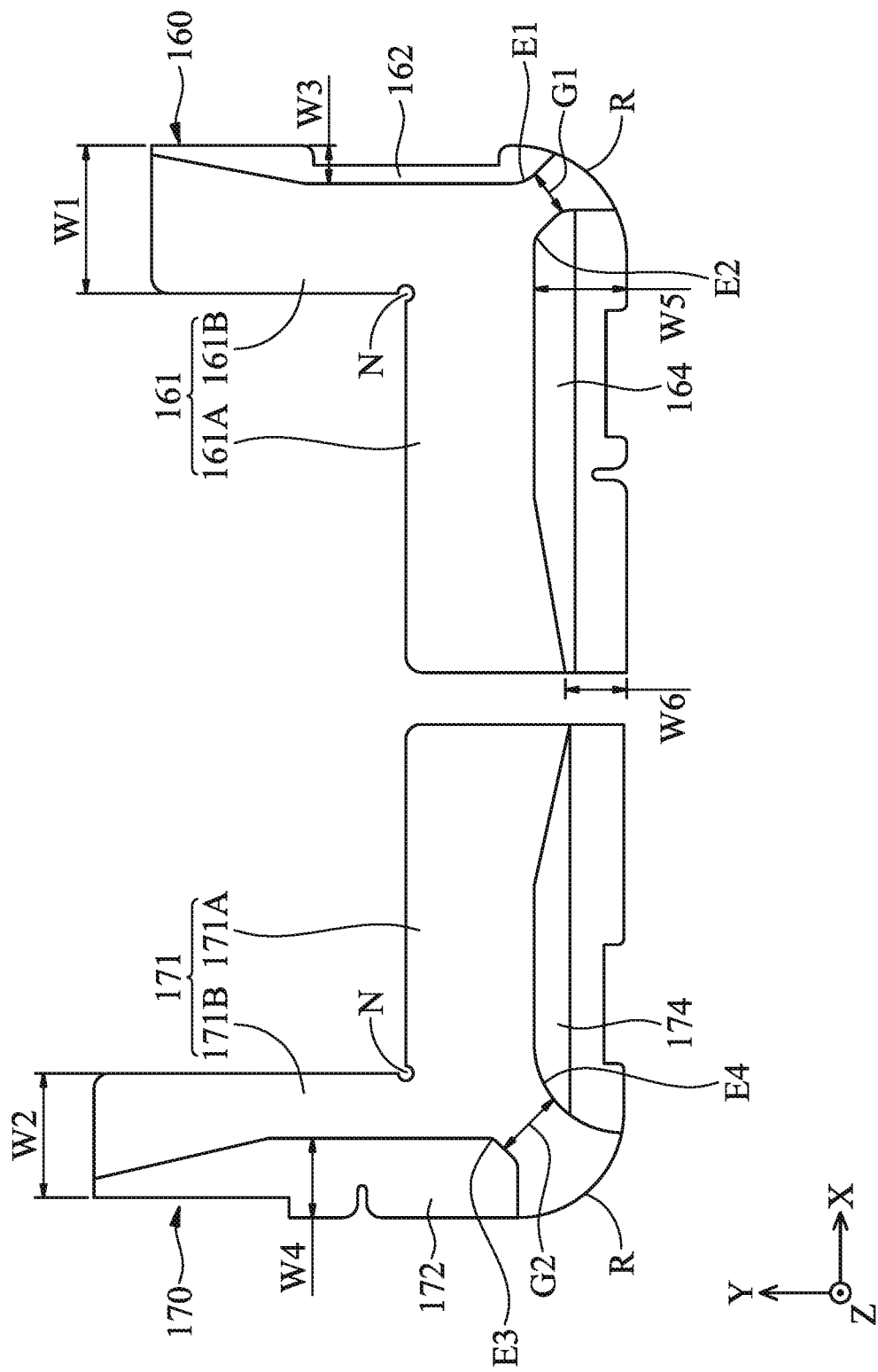
FIG. 6 is a top view illustrating a first cushioning component and a second cushioning component in accordance with some embodiments of the present disclosure.
Figure 7:
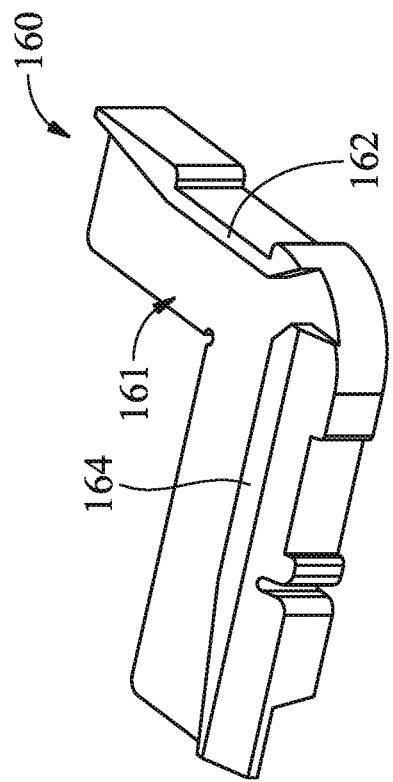
FIG. 7 is a perspective view illustrating the first cushioning component and the second cushioning component in accordance with some other embodiments of the present disclosure.
Figure 7:
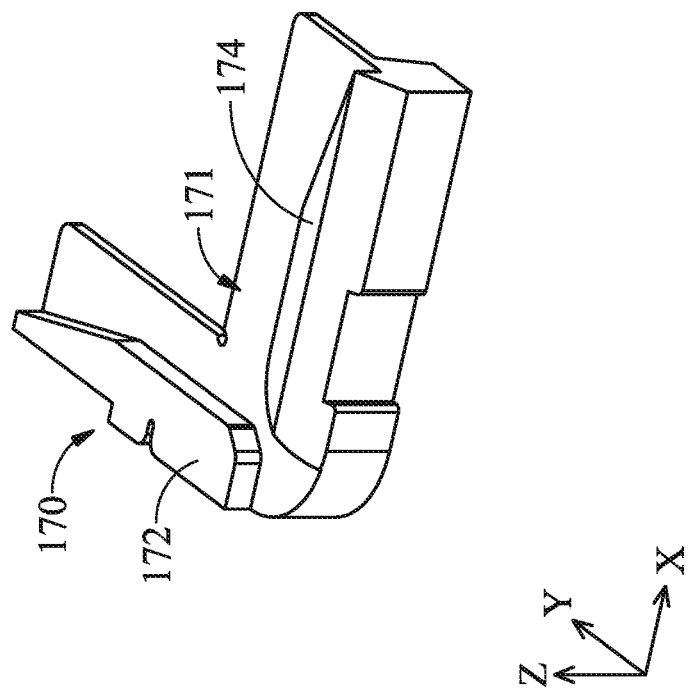

FIG. 6 is a top view illustrating the first cushioning component 160 and the second cushioning component 170 in accordance with some embodiments of the present disclosure, and FIG. 7 is a perspective view illustrating the first cushioning component 160 and the second cushioning component 170 in accordance with some embodiments of the present disclosure. As shown in FIG. 6, the second cushioning component 170 further includes a side portion 174, which is disposed relative to the side portion 172. More specifically, a second gap G2 is formed between the side portion 172 and the side portion 174, and the second gap G2 corresponds to the second corner 150B of the panel 150. In some embodiments, the panel 150 may contact the side portion 174 and the side portion 172, and the second gap G2 may accommodate the second corner 150B of the panel 150. A rounded corner or a chamfer may be disposed at an end portion E3 of the side portion 172 and an end portion E4 of the side portion 174, the end portion E3 and the end portion E4 face the second gap G2, which may help to accommodate the second corner 150B of the panel 150. In the present embodiment, the minimum width of the second gap G2 (that is, the shortest distance between the side portion 172 and the side portion 174) may be greater than the minimum width of the first gap G1 (that is, the shortest distance between the side portion 162 and the side portion 164).

In the present embodiment, the main portion 161 of the first cushioning component 160 includes a first region 161A and a second region 161B, the first region 161A and the second region 161B extend along a substantially vertical direction (for example, the X direction and the Y direction), and the side portion 164 is located substantially on the first region 161A, and the side portion 162 is located substantially on the second region 161B. Similarly, the main portion 171 of the second cushioning component 170 includes a first region 171A and a second region 171B, the first region 171A and the second region 171B extend in a substantially vertical direction (for example, the X direction and the Y direction), and the side portion 174 is located substantially on the first region 171A, and the side portion 172 is located substantially on the second region 171B. The width of the second region 161B of the main portion 161 (i.e. the first width W1) may be greater than the width of the second region 171B of the main portion 171 (i.e. the second width W2), wherein the first width W1 and the second width W2 are measured along the X direction. In addition, the maximum width of the side portion 162 (i.e. the third width W3) may be less than the maximum width of the side portion 172 (i.e. the fourth width W4), wherein the third width W3 and the fourth width W4 are measured along the X direction. In some embodiments, the first cushioning component 160 is closer to the circuit board 152 than the second cushioning component 170 (that is, the shortest distance d1 between the circuit board 152 and the side portion 162 of the first cushioning component 160 is less than the shortest distance d2 between the circuit board 152 and the side portion 172 of the second cushioning component 170), so the main portion 161 has a larger width than the main portion 171 (for example, the first width W1 is greater than the second width W2), and the side portion 162 has a less width than the side portion 172 (for example, the third width W3 is less than the fourth width W4) to provide a space for accommodating the electrical connection element.

Figure 8:
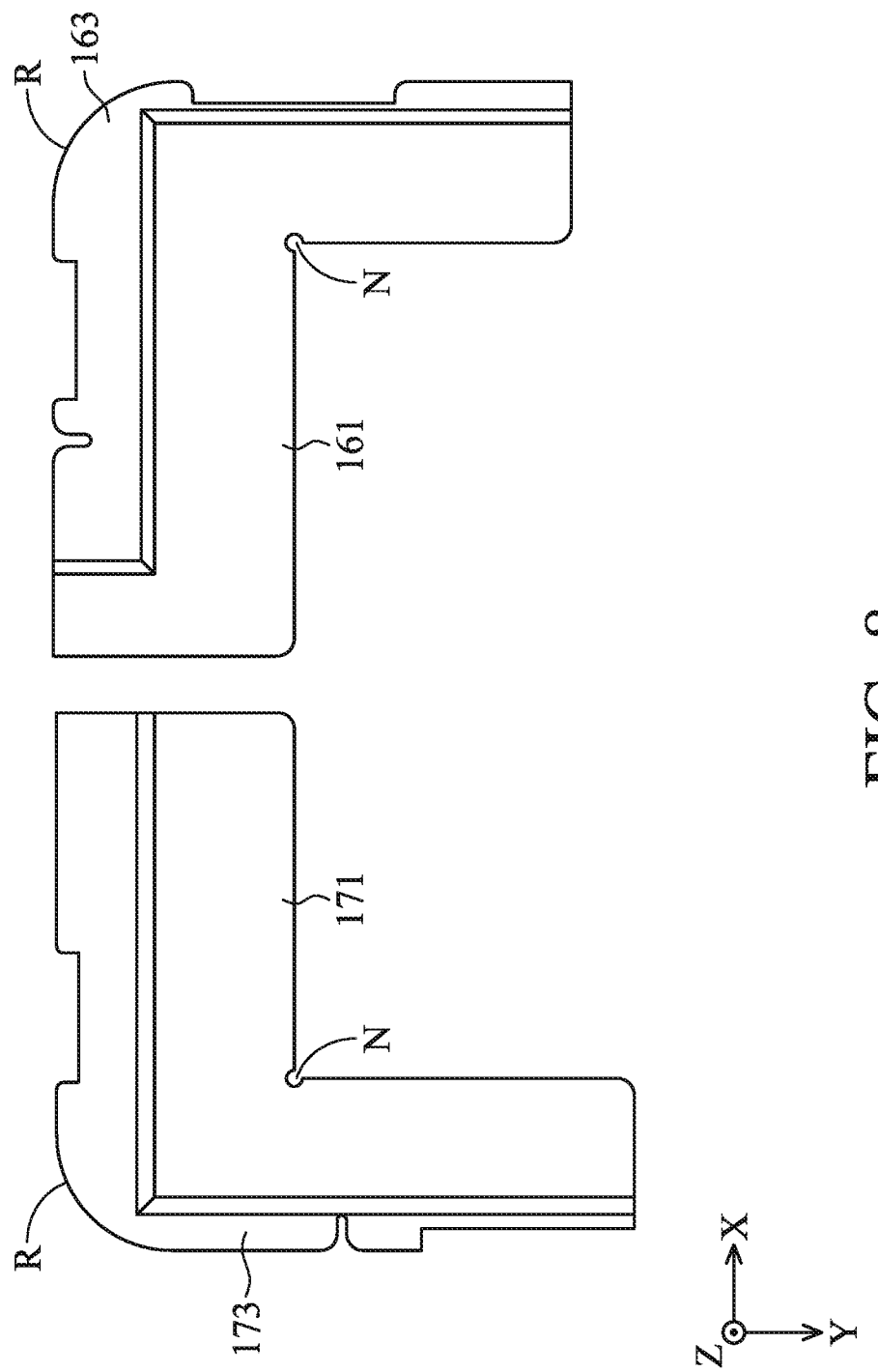
FIG. 8 is a bottom view illustrating the first cushioning component and the second cushioning component in accordance with some embodiments of the present disclosure.
Figure 9:
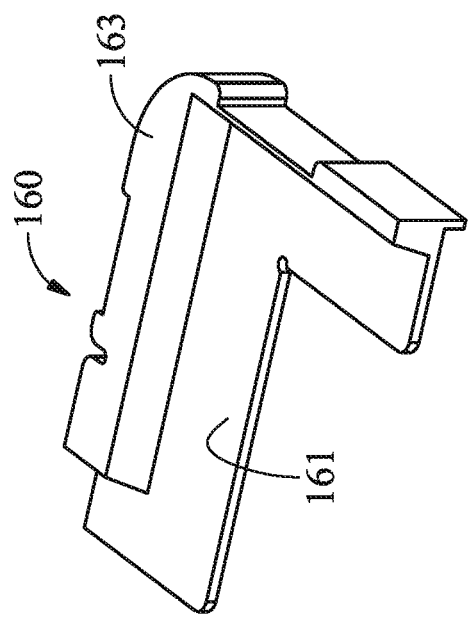
FIG. 9 is a perspective view illustrating the first cushioning component and the second cushioning component in accordance with some other embodiments of the present disclosure
Figure 9:
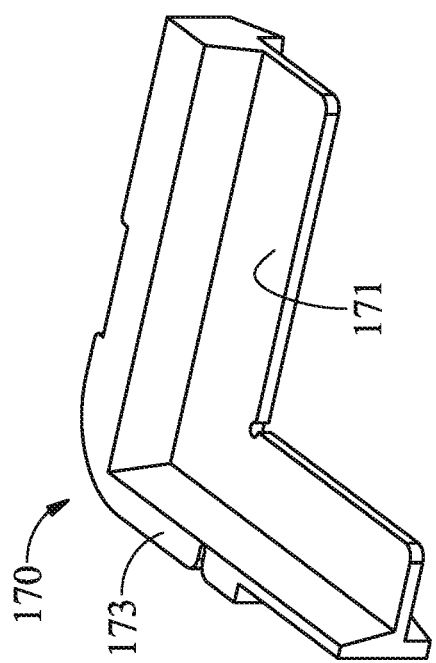
Figure 9:
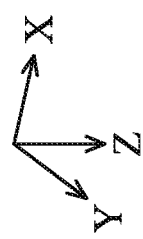

FIG. 8 is a bottom view illustrating the first cushioning component 160 and the second cushioning component 170 in accordance with some embodiments of the present disclosure, and FIG. 9 is a perspective view illustrating the first cushioning component 160 and the second cushioning component 170 in accordance with some embodiments of the present disclosure. As shown in FIG. 8, the first cushioning component 160 has a support portion 163, wherein the support portion 163 and the side portion 162, the side portion 164 are located on opposite sides of the main portion 161. In other words, the main portion 161 is located between the support portion 163 and the side portion 162, the side portion 164. Similarly, the second cushion 170 has a support portion 173, wherein the support portion 173 and the side portion 172, the side portion 174 are located on opposite sides of the main portion 171. In other words, the main portion 171 is located between the support portion 173 and the side portion 172, the side portion 174. The relationship between the top view and the bottom view is that they are two opposite viewing angles on the same axis. The top view is viewed from the positive Z-axis viewing angle (the paper-entering direction), and the bottom view is viewed from the negative Z-axis viewing angle (the paper-exiting direction). For example, FIG. 6 is a top view which is viewed from the positive Z-axis direction (the paper-entering direction), and FIG. 8 is a bottom view which is viewed from the negative Z-axis direction (the paper-exiting direction).

As set forth above, the embodiments of the present disclosure provide an electronic device including a plurality of cushioning components. In the embodiment of the present disclosure, a cushioning component with a Young's modulus of 500 MPa to 1500 MPa is disposed to protect the panel from damage due to contact with the cushioning component. As such, the cushioning component may be directly disposed beside the panel of the electronic device, so as to provide a cushion between the panel and the rigid element (e.g. the back plate, the housing, etc.), or the size of the electronic device can be reduced. In addition, the cushioning component has a specific shape, which may be configured for positioning during the assembly of the panel, thereby reducing the difficulty of assembly, improving the yield of the electronic device, and also reducing the possibility that the panel is damaged due to collision with other components of the electronic device.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments in the present disclosure may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An electronic device, comprising:
    a panel comprising a bottom surface, a first corner, and a second corner, and the bottom surface connecting between the first corner and the second corner;
    a first cushioning component supporting the first corner of the panel; and
    a second cushioning component supporting the second corner of the panel,
    wherein a Young's modulus of the first cushioning component and a Young's modulus of the second cushioning component are ranged from 500 MPa to 1500 MPa, and wherein the panel further comprises a substrate, a counter substrate and a circuit board, the counter substrate and the circuit board are disposed on the substrate, and the circuit board is adjacent to the counter substrate.

2. The electronic device as claimed in claim 1, wherein the first cushioning component comprises:
    a main portion;
    a first side portion protruding from the main portion; and
    a support portion protruding from the main portion, wherein the support portion and the first side portion are located on opposite sides of the main portion.

3. The electronic device as claimed in claim 2, wherein the first side portion contacts the panel.

4. The electronic device as claimed in claim 2, further comprising:
    a back plate disposed under the panel; and
    a reflective sheet disposed between the back plate and the support portion.

5. The electronic device as claimed in claim 2, wherein the main portion has a rounded corner, and a corner of the panel is disposed corresponding to the rounded corner.

6. The electronic device as claimed in claim 2, further comprising an optical film disposed between the first cushioning component and the second cushioning component, wherein a thickness of the main portion is greater than a thickness of the optical film.

7. The electronic device as claimed in claim 6, wherein the thickness of the main portion is in a range from 1.2 mm to 1.6 mm.

8. The electronic device as claimed in claim 6, wherein the main portion has a notch disposed facing the optical film.

9. The electronic device as claimed in claim 6, wherein the optical film is separated from the first cushioning component.

10. The electronic device as claimed in claim 2, wherein an end portion of the first side portion is adjacent to the first corner, and the end portion is a rounded corner or a chamfer.

11. The electronic device as claimed in claim 2, wherein a width of an end portion of the first side portion adjacent to the first corner is greater than a width of another end portion of the first side portion away from the first corner.

12. The electronic device as claimed in claim 2, further comprising a diffusion plate disposed under the main portion and adjacent to the support portion.

13. The electronic device as claimed in claim 2, further comprising a polarizer sheet disposed on the main portion.

14. The electronic device as claimed in claim 13, wherein a ratio of a thickness of the second side portion to an overall thickness of the panel and the polarizer sheet is in a range from 90% to 110%.

15. An electronic device, comprising:
    a panel comprising a bottom surface, a first corner, and a second corner, and the bottom surface connecting between the first corner and the second corner;
    a first cushioning component supporting the first corner of the panel, wherein the first cushioning component comprises:
        a main portion;
        a first side portion protruding from the main portion;
        a support portion protruding from the main portion, wherein the support portion and the first side portion are located on opposite sides of the main portion; and
        a second side portion protruding from the main portion, wherein a first gap is formed between the first side portion and the second side portion, and the first gap corresponds to the first corner; and
    a second cushioning component supporting the second corner of the panel,
    wherein a Young's modulus of the first cushioning component and a Young's modulus of the second cushioning component are ranged from 500 MPa to 1500 MPa.

16. The electronic device as claimed in claim 15, wherein the second cushioning component comprises:
    a main portion;
    a third side portion protruding from the main portion; and
    a fourth side portion protruding from the main portion, wherein a second gap is formed between the third side portion and the fourth side portion, the second gap corresponds to the second corner, and a minimum width of the first gap is less than a minimum width of the second gap.

17. The electronic device as claimed in claim 16, wherein the panel is located between the second side portion and the fourth side portion, and a maximum width of the second side portion is less than a maximum width of the fourth side portion.

18. An electronic device, comprising:
    a panel comprising a bottom surface, a first corner, and a second corner, and the bottom surface connecting between the first corner and the second corner;
    a first cushioning component supporting the first corner of the panel, wherein the first cushioning component comprises:
        a main portion;
        a first side portion protruding from the main portion, wherein the first side portion has a beveled edge disposed facing the panel, and the beveled edge extends in a direction away from the panel; and
        a support portion protruding from the main portion, wherein the support portion and the first side portion are located on opposite sides of the main portion; and
    a second cushioning component supporting the second corner of the panel,
    wherein a Young's modulus of the first cushioning component and a Young's modulus of the second cushioning component are ranged from 500 MPa to 1500 MPa.

19. The electronic device as claimed in claim 1, wherein a shortest distance between the circuit board and the first cushioning component is less than a shortest distance between the circuit board and the second cushioning component.

* * * * *